(12) United States Patent
Feler et al.

(10) Patent No.: US 10,754,261 B2
(45) Date of Patent: Aug. 25, 2020

(54) RETICLE OPTIMIZATION ALGORITHMS AND OPTIMAL TARGET DESIGN

(71) Applicant: KLA-Tencor Corporation, Milpitas, CA (US)

(72) Inventors: Yoel Feler, Haifa (IL); Vladimir Levinski, Migdal HaEmek (IL)

(73) Assignee: KLA-Tencor Corporation, Milpitas, CA (US)

( * ) Notice: Subject to any disclaimer, the term of this patent is extended or adjusted under 35 U.S.C. 154(b) by 7 days.

(21) Appl. No.: 15/571,427

(22) PCT Filed: Jun. 6, 2017

(86) PCT No.: PCT/US2017/036219
§ 371 (c)(1),
(2) Date: Nov. 2, 2017

(87) PCT Pub. No.: WO2018/226215
PCT Pub. Date: Dec. 13, 2018

(65) Prior Publication Data
US 2018/0348648 A1    Dec. 6, 2018

(51) Int. Cl.
*G03F 7/20* (2006.01)
*G03F 1/44* (2012.01)

(52) U.S. Cl.
CPC ............ *G03F 7/70633* (2013.01); *G03F 1/44* (2013.01); *G03F 7/7015* (2013.01); *G03F 7/70683* (2013.01)

(58) Field of Classification Search
CPC .......................... G03F 7/7015; G03F 7/70633
USPC .................................................. 356/399–401
See application file for complete search history.

(56) References Cited

U.S. PATENT DOCUMENTS

| | | | |
|---|---|---|---|
| 10,228,320 B1 | 3/2019 | Levinski et al. | |
| 2003/0223630 A1 | 12/2003 | Adel et al. | |
| 2006/0062445 A1* | 3/2006 | Verma | G06F 17/5068 382/144 |
| 2007/0105029 A1* | 5/2007 | Ausschnitt | B81C 99/0065 430/30 |

(Continued)

FOREIGN PATENT DOCUMENTS

| | | |
|---|---|---|
| WO | 2016123552 A1 | 8/2016 |
| WO | 2017176314 A1 | 10/2017 |

OTHER PUBLICATIONS

ISA/KR, International Search Report for PCT/US2017/036219 dated Mar. 5, 2018.

*Primary Examiner* — Isiaka O Akanbi
(74) *Attorney, Agent, or Firm* — Hodgson Russ LLP

(57) ABSTRACT

Metrology target designs on the reticle and on the wafer, and target design and processing methods are provided. Target designs comprise coarse pitched periodic structures having fine pitched sub-elements, which vary in sub-element CD and/or height, an orthogonal periodic structure, perpendicular to the measurement direction, with an orthogonal unresolved pitch among periodically recurring bars, which provide a calibration parameter for achieving well-printed targets. Orthogonal periodic structures may be designed on the reticle and be unresolved, or be applied in cut patterns on the process layer, with relatively low sensitivity to the cut layer overlay. Designed targets may be used for overlay metrology as well as for measuring process parameters such as scanner aberrations and pitch walk.

9 Claims, 7 Drawing Sheets

(56) References Cited

U.S. PATENT DOCUMENTS

| | | | |
|---|---|---|---|
| 2011/0249244 A1* | 10/2011 | Leewis | G03F 7/706 |
| | | | 355/27 |
| 2012/0044470 A1 | 2/2012 | Smilde et al. | |
| 2012/0217384 A1* | 8/2012 | Nagura | G01D 5/34746 |
| | | | 250/231.13 |
| 2013/0328155 A1* | 12/2013 | Konomi | G06F 17/5068 |
| | | | 257/499 |
| 2014/0002822 A1 | 1/2014 | Chen et al. | |
| 2015/0177135 A1* | 6/2015 | Amit | G01N 21/47 |
| | | | 702/150 |
| 2015/0309402 A1 | 10/2015 | Levinski et al. | |
| 2015/0370942 A1* | 12/2015 | Lin | G06F 17/5068 |
| | | | 716/54 |
| 2016/0266505 A1* | 9/2016 | Amit | H01L 22/12 |
| 2016/0320711 A1* | 11/2016 | Quintanilha | G03F 7/70625 |
| 2017/0146810 A1 | 5/2017 | Levinski et al. | |

* cited by examiner

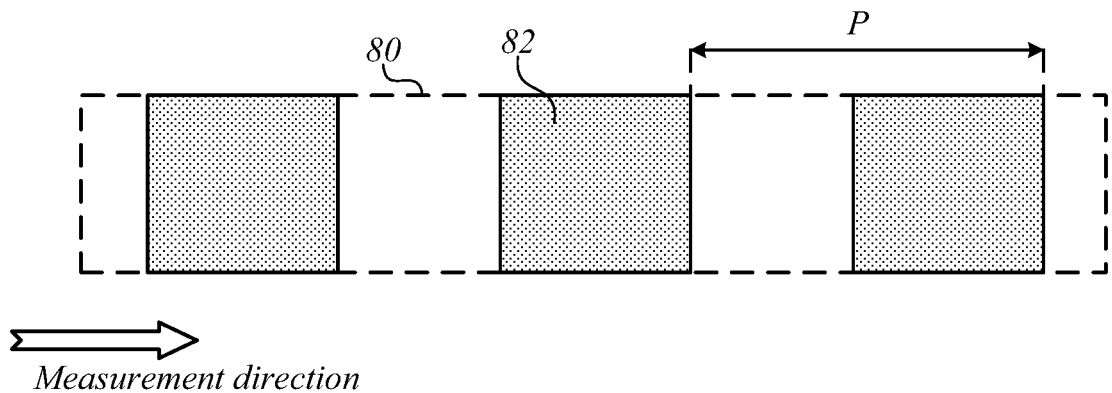
Figure 2A – Prior art
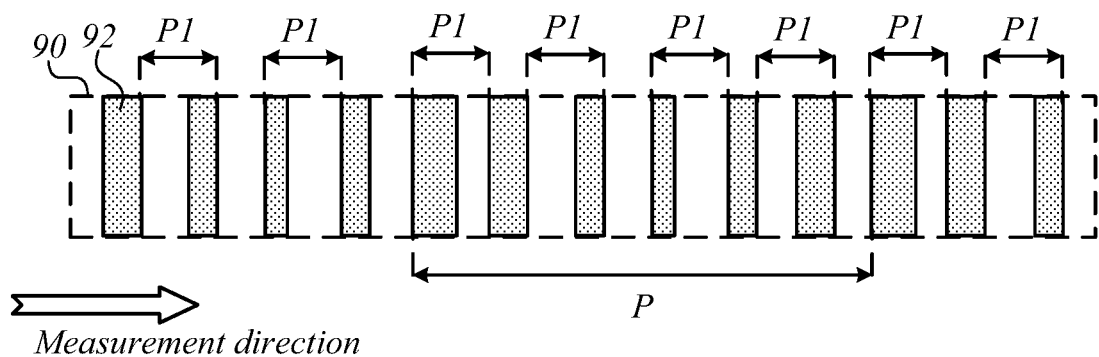
Figure 2B – Prior art
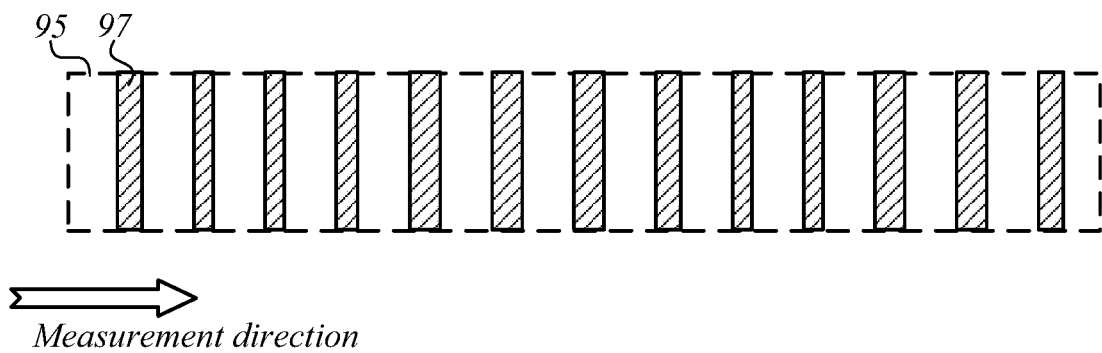
Figure 2C – Prior art

RETICLE OPTIMIZATION ALGORITHMS AND OPTIMAL TARGET DESIGN

BACKGROUND OF THE INVENTION

1. Technical Field

The present invention relates to the field of metrology, and more particularly, to overlay target design.

2. Discussion of Related Art

Periodic targets are widely used for overlay measurements, however, overlay targets face the continuous challenge of having to provide both detectable measurement results and compliance with produced devices, which become ever smaller and are specifically designed with respect to their production processes.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology target design comprising a periodic structure along a measurement direction, having a coarse pitch among periodically recurring elements, wherein each element is periodic along the measurement direction with a fine pitch among periodically recurring sub-elements, which vary in sub-element CD (critical dimension), wherein the coarse pitch is an integer multiple of the fine pitch, and wherein the target design further comprises an orthogonal periodic structure, perpendicular to the measurement direction, with an orthogonal unresolved pitch among periodically recurring bars, wherein the orthogonal unresolved pitch is smaller than a specified minimal design rule pitch.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 2A-2C are high level schematic illustrations of prior art target designs.

DETAILED DESCRIPTION OF THE INVENTION

Figures 1A, 1B:
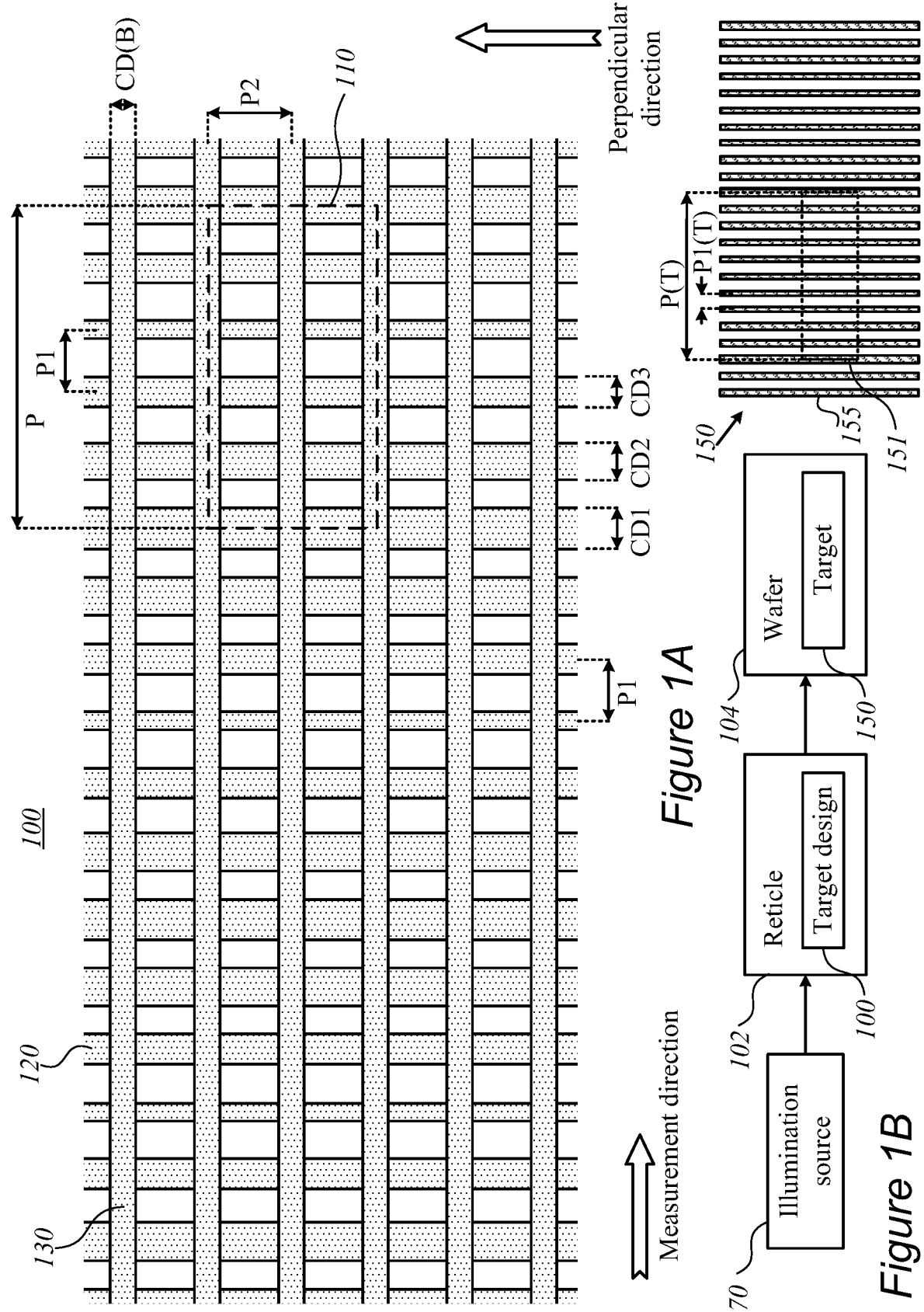
FIG. 1A is a high level schematic illustration of a metrology target design, according to some embodiments of the invention.
FIG. 1B is a high level schematic and highly simplified illustration of the settings of the lithography process, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Overlay control is one of the main challenges of current lithography. Generally it is achieved by printing special marks, or targets on the wafer, with respect to which the overlay is measured. During the design of the mask, or reticle, the printability (process window) and aberration stability issues must be taken into account. This makes the design of the mask a very difficult task, which includes both simulations and experimental parts. One of the ways to handle the problem is the usage of the assist unprintable features on the mask (Assist Sub-Resolution Features ASRAF). These features are not printed by themselves (as they are sub-resolved), however they improve printability of the designed structures and reduce their sensitivity to scanner's aberrations. However, the usage of assist features adds a huge number of degrees of freedom which together with the absence of generic methodology pushes the target design domain to use a trial and error approach.

Advantageously, disclosed target designs and methods make the design process of overlay targets more intuitive and predictable, by combining CD-modulation and field-modulation targets with an orthogonal periodic structure, perpendicular to the measurement direction and having an unresolved pitch.

Metrology target designs on the reticle and on the wafer, and target design and processing methods are provided. Target designs comprise coarse pitched periodic structures having fine pitched sub-elements, which vary in sub-element CD and/or height, an orthogonal periodic structure, perpendicular to the measurement direction, with an orthogonal unresolved pitch among periodically recurring bars, which provide a calibration parameter for achieving well-printed targets. Orthogonal periodic structures may be designed on the reticle and be unresolved, or be applied in cut patterns on the process layer, with relatively low sensitivity to the cut layer overlay. Designed targets may be used for overlay metrology as well as for measuring process parameters such as scanner aberrations and pitch walk.

FIG. 1A is a high level schematic illustration of a metrology target design 100, according to some embodiments of the invention. Illustrated is target design 100 on the reticle (photoreticle, used in lithography to define patterned layers on the wafer, also termed mask or photomask), which is used to produce a corresponding target on the wafer, which may have some different features, as explained below. Metrology target design 100 comprises a periodic structure along a measurement direction, having a coarse pitch P among periodically recurring elements 110. Each element 110 is periodic along the measurement direction with a fine pitch P1 among periodically recurring sub-elements 120. Sub-elements 120 vary in sub-element CD (critical dimension, denoted CD1, CD2, CD3 etc.), with the coarse pitch P being an integer multiple of the fine pitch P1 (P=n–P1 with n being an integer, in the illustrated non-limiting example n=5). Target design 100 further comprises an orthogonal periodic structure having periodically recurring bars 130, perpendicular to the measurement direction, with an orthogonal unresolved pitch P2 among periodically recurring bars 130, which have a CD of CD(B). The unresolved orthogonal pitch P2 is smaller than a specified minimal design rule pitch and is therefore not printed on the wafer itself, but merely help provides controllable targets, as explained below. It is noted that element 110 is denoted somewhat arbitrarily as a unit cell, and could have been chosen in different locations of metrology target design 100.

FIG. 1B is a high level schematic and highly simplified illustration of the settings of the lithography process, according to some embodiments of the invention. Targets 150 on a wafer 104 are produced using illumination from illumination source 70 which is projected through a reticle 102 (also termed mask) with target design 100 thereupon. Clearly, reticle 102 typically includes circuit design data and possibly multiple target designs 100, relating to one, or possibly more layers of integrated circuit(s) produced on wafer 104. The disclosed description of target designs 100 and targets 150 relates merely to these components on reticle 102 and wafer 104, respectively, and are typically part of much more complex designs. Certain embodiments comprise lithography reticle(s) 102 comprising metrology target designs 100 disclosed herein. Certain embodiments comprise wafers 104 comprising metrology target(s) 150 produced using metrology target design(s) 100 disclosed herein, as well as metrology target(s) 150 themselves. Certain embodiments comprise target design file of metrology target(s) 150. Certain embodiments comprise metrology overlay measurements target design file of metrology targets 150.

Specifically, metrology target(s) 150 (part thereof illustrated schematically in FIG. 1B) may comprise target periodic structure 150 along the measurement direction, having a target coarse pitch (P(T)) among periodically recurring target elements 151, wherein each target element 151 is periodic along the measurement direction with a target fine pitch (P1(T)) among periodically recurring target sub-elements 155, which vary in target sub-element CD (see in FIG. 5), wherein target coarse pitch P(T) is an integer multiple of target fine pitch P1(T), P(T)=n·P1(T) for integer n. Non-limiting examples for metrology target(s) 150 are presented in FIG. 5.

FIGS. 2A-2C are high level schematic illustrations of prior art target designs 80. As illustrated schematically in FIG. 2A, typical target design for overlay measurements comprises a periodic structure with elements 82 set at a pitch P. Target design on the reticle and actual target geometry are similar as all elements 82 are printed. It is noted that pitch P is large (much larger than the minimal design rule, typically larger than 1000 nm, as required for achieving optical resolution with the illumination spectrum in the visual range. However, as designs 80 leaves wide empty spaces and wide unsegmented bar 82, they are generally process incompatible and cause significant bias with respect to devices due to asymmetric scanner aberrations.

FIGS. 2B and 2C illustrate, respectively, prior art target designs 90, 95 on the reticle and on the wafer, respectively. Prior art design 90 includes segmentation of wide bars 82 into a finely segmented periodic structure, having elements 92 repeating with a fine pitch P1, which yields device-like structures within the coarse pitch P. elements 92 have pitch P1 which is in the order of magnitude or even the same as device structures (minimal design rule pitch), and the required optical resolution is achieved by setting the parameters of device-like printed structures 97 to vary over the coarse pitch, as disclosed in more details in U.S. patent application Ser. No. 14/820917 and WIPO Application No. PCT/US16/60626, which are incorporated herein by reference in their entirety.

However, the inventors have found out that targets designs 90 have too many free parameters which influence the resulting performance, and optimizing all of them simultaneously may be a quite difficult task. For example, in target design 90, the free parameters include the width values of each of bars 92 and make sure that all bars 92 are printed and have a large enough process window. This is a significant challenge, requiring well-calibrated simulations which are rarely available due to the difficulty of calibrating the chemistry of the resist, which is therefore typically handled by a trial and error approach. However, as the number of combinations of different CD values is huge, this prior art approach almost inapplicable. The inventors have found out that analysis is hampered by discontinuities and non-differentiable regions, which also prevent forming intuitive rules of thumb for guessing the conditions for target 95 to be well-printed.

As a solution to these difficulties, the inventors suggest, in target designs 100, to reduce significantly the number of varying parameters in target design 100 and to use parameters which affect the target printability in an intuitive way from a physical point of view. Since the main printability problem is connected to the luck of knowning of correct value of aerial image threshold, the inventors suggested using orthogonal bars 130 to control the printability of sub-elements 120 and their parameters, while keeping orthogonal bars 130 themselves not printed and unresolved in direction perpendicular to printed structures 155.

Figure 3:
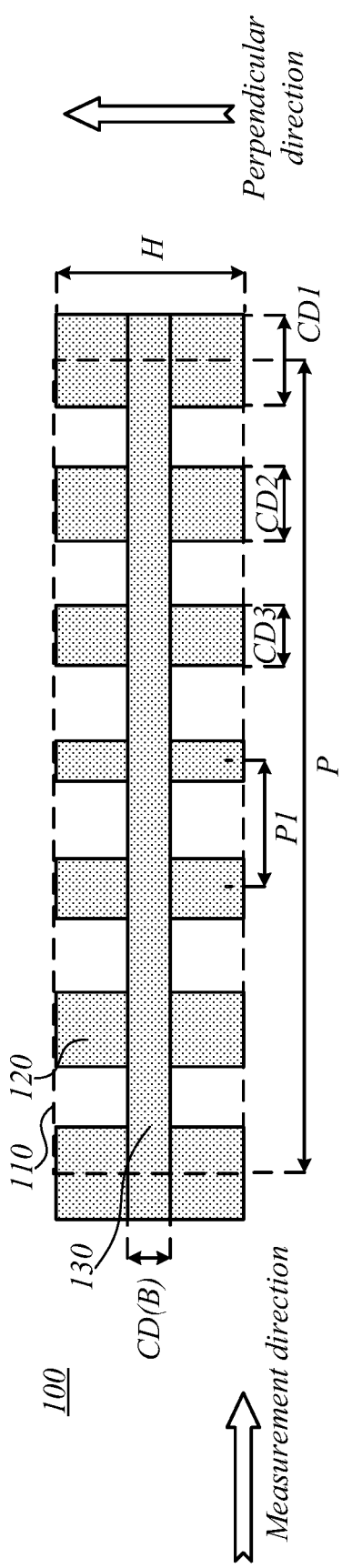
FIGS. 3 and 4 are high level schematic illustrations of metrology target designs, according to some embodiments of the invention.
Figure 4:
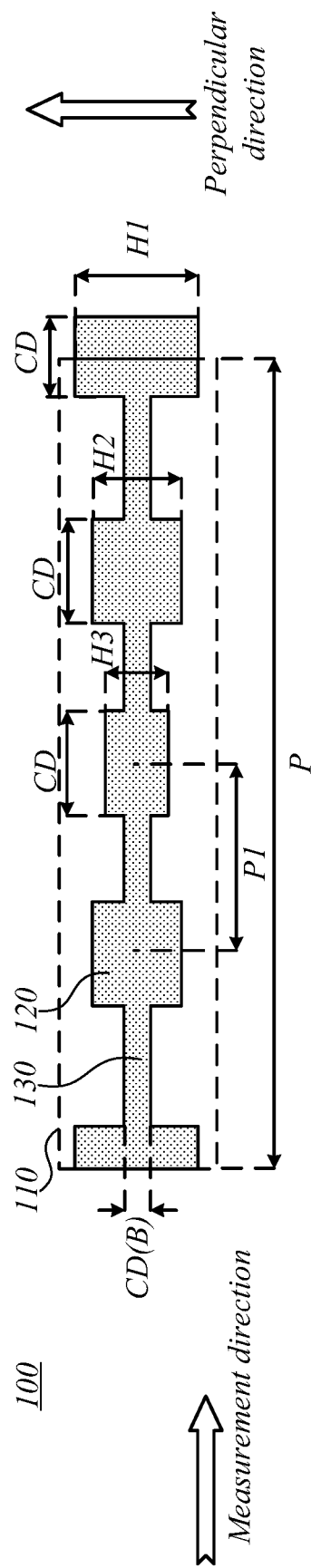

FIGS. 3 and 4 are high level schematic illustrations of metrology target design 100, according to some embodiments of the invention. It is noted that FIGS. 3 and 4 merely illustrate a small part of respective target designs 100, for the purpose of explaining their design principles, namely that (i) added orthogonal pattern 130 is periodic in the perpendicular direction (to the measurement direction) and has pitch P2 (see FIG. 1A) which is smaller than the minimal design rule pitch and is therefore unresolved by the printing tool's optical system; (ii) added orthogonal pattern 130 does not affect the positions of the diffraction orders (from elements 110, 120 in the measurement direction) in the pupil plane of the metrology system and, correspondingly, in quasi two-beam imaging scheme provided by CD modulation targets (having different CD's for sub-elements 120), pattern 130 does not change the position of the printed pattern in the field plane (causing no bias with respect to the devices); and (iii) by varying the width (CD(B)) of orthogonal bars 130, the intensity of zero and first diffraction orders may be varied and may be used to easily find an appropriate value for the given parameter which provides a good printability condition. FIG. 4 illustrates schematically variants of target designs 100 having sub-elements 120 with varying heights (H1, H2, H3 etc.) and same width (CD), to which orthogonal bars 130 are added.

Figure 5:
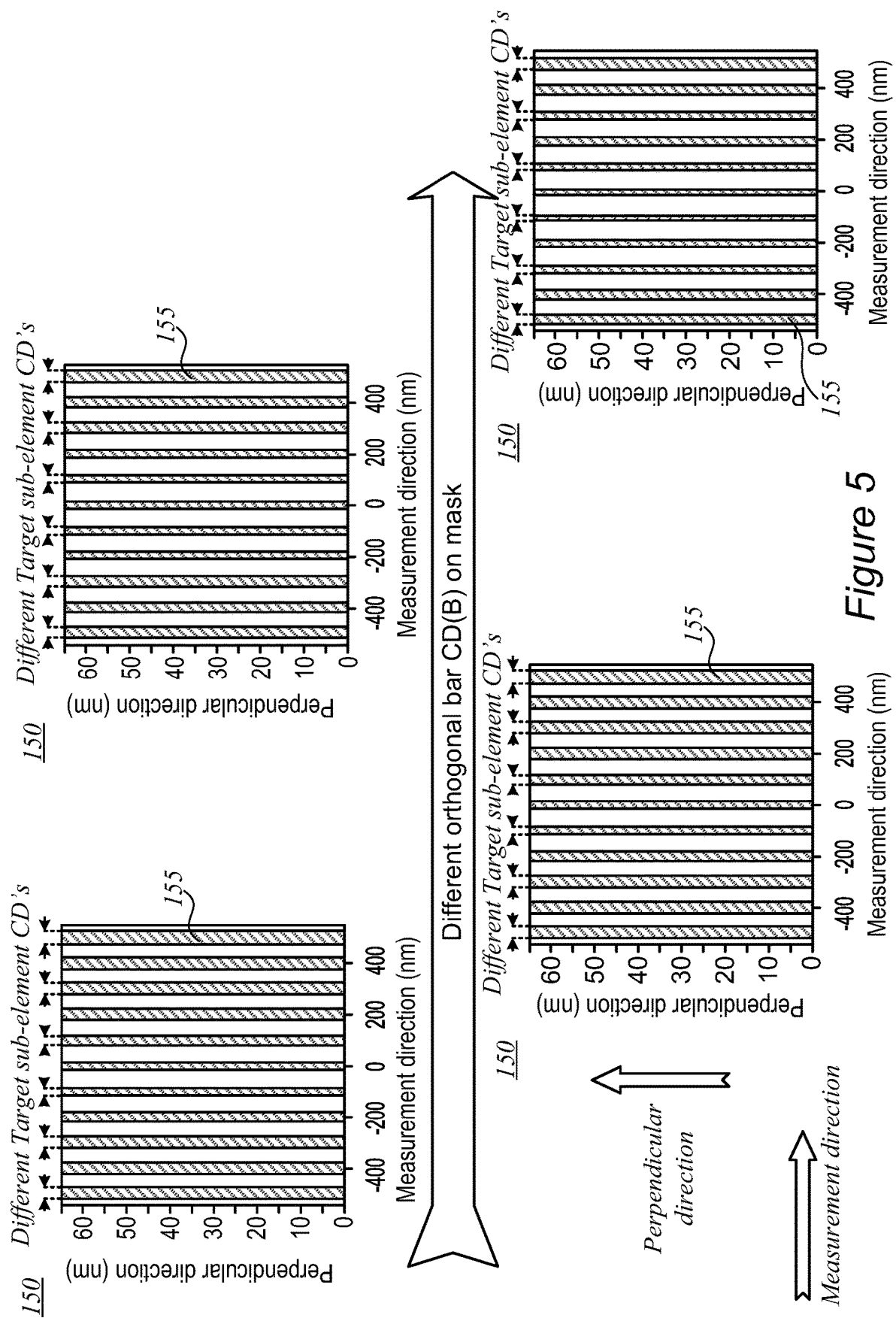
FIG. 5 is a high level schematic illustration of printed metrology targets using target designs with varying width of orthogonal bars, according to some embodiments of the invention.

FIG. 5 is a high level schematic illustration of printed metrology targets 150 using target designs 100 with varying width (CD(B)) of orthogonal bars 130, according to some embodiments of the invention. Printed metrology targets 150 illustrated in FIG. 5 were printed using target designs 100 illustrated in FIG. 1A and 3, as non-limiting examples. FIG. 5 demonstrates that varying the width (CD(B)) of orthogonal bars 130 results in different widths (CD's) of target sub-elements 155, allowing simple selection of the optimal CD(B). As the resulting set of candidate targets 150 and corresponding designs 100 depends on a single parameter (CD(B)), is physically more intuitive and allows simple fitting of other process parameters, e.g., fitting the amount of light exposed to any value of aerial image threshold—as it involves varying only one parameter in target design 100.

It is noted that the disclosed approach of introducing orthogonal periodic structure 130, perpendicular to the measurement direction and having an unresolved pitch, may be used as a general principle in a wide range of metrology overlay targets, and not only ones with variable CD's of fine sub-elements as shown above.

Referring back to FIG. 4, it is noted that sub-elements 120 may be designed to have varying heights (H1, H2, H3 etc.) instead of (or possibly in addition to) having varying widths (CD1, CD2, CD3, etc.) to provide other (or additional) parameters for the optimization process. The modulation in vertical direction may be set to be unresolved and not affect the positions of diffraction orders in the pupil plane, forming no bias with respect to the devices, but still affects the mask's transmittance properties, as explained e.g., in U.S. Patent Application Publication No. 2015/0309402, incorporated herein by reference in its entirety. Target designs 100 such as disclosed in FIG. 4 may be used to add additional flexibility (e.g., widths of bars 130 and heights of sub-elements 120) for achieving good printability conditions.

Advantageously, disclosed embodiments enable using a single parametric relaxation of the optimization process and possibly build the CD-modulation of sub-elements 120 and printed targets 150 with unified parametric sets. Moreover, disclosed embodiments provide innovative mask design capabilities including effective Aerial image threshold control using a single parametric family optimization, and a unified target design optimization relaxation using heights and/or widths of sub-elements 120.

Figure 6A:
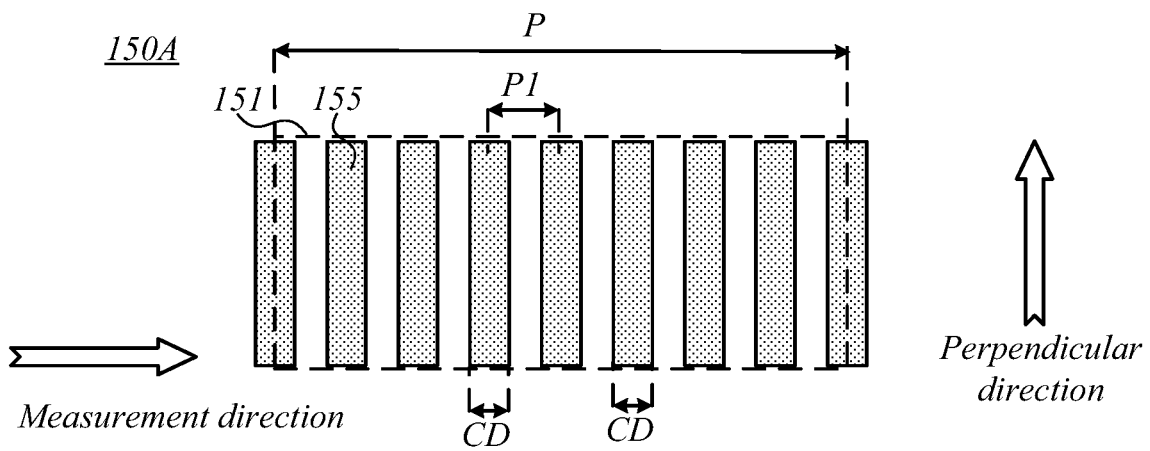
FIGS. 6A-6C are high level schematic illustrations of printed metrology targets, according to some embodiments of the invention.
Figure 6B:
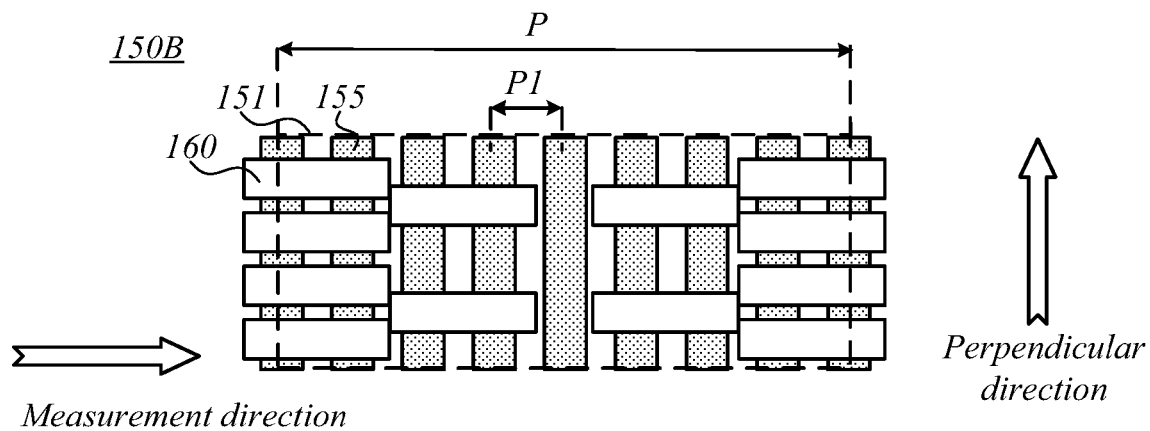
Figure 6C:
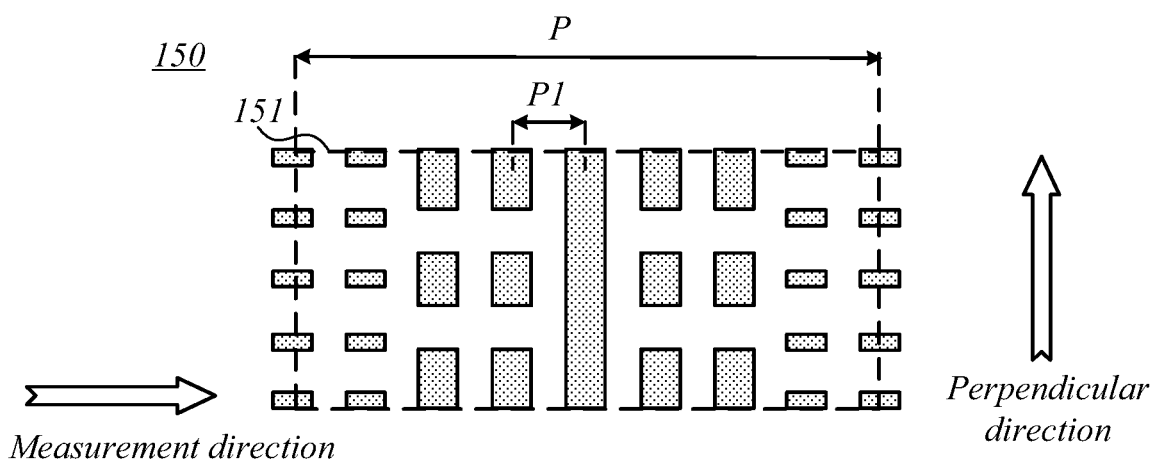

FIGS. 6A-6C are high level schematic illustrations of printed metrology targets 150, according to some embodiments of the invention. It is noted that FIGS. 6A-6C merely illustrate a small part, corresponding to one period, of respective metrology target production stages 150A, 150B and 150, respectively, for the purpose of explaining their design principles FIGS. 6A-6C illustrate schematically process stages 150A, 150B for producing targets 150, respectively, on the wafer. Metrology targets 150 may comprise periodic structure 151 along the measurement direction, having coarse pitch (P) among periodically recurring elements 151, wherein each element 151 is periodic along the measurement direction with fine pitch (P1) among periodically recurring sub-elements 155 and all sub-elements 155 have the same CD. Sub-elements 155 may be cut (moving from patterns 150A to pattern 150B in FIGS. 6A and 6B, respectively) by an orthogonal periodic structure 160, perpendicular to the measurement direction, having periodically recurring cuts. The inventors have found out that the cuts may be configured to simulate CD modulation of printed target 150, and simplify the production process. Sub-elements 155 may be configured to represent device structures without any CD variation (thereby avoiding printability problems) while the cutting process transfers these structures into effectively CD-modulated target 150 which is measurable by the metrology optical tool.

Sub-elements 155 may have varying CD's (as illustrated e.g., in FIGS. 1A and 1B) or have a same CD. Disclosed targets 150 with sub-elements 155 with a same CD may have better printability than sub-elements 155 varying CD's and achieve an almost zero offset with respect to device structures. Respective overlay targets 150 may be used for metrology overlay measurements.

In certain embodiments, a standard device printing procedure, which includes printing of periodic gratings with minimal design rule and subsequent lines cutting in the perpendicular direction, is utilized for producing targets 150. It is noted that as this procedure is applicable only for targets 150 in the process layer as they involve cuts, however just these targets pose a main challenge from the process compatibility point of view.

Coarse pitch (P) may be configured to be resolved by the metrology tool optics, operating e.g., above 400 nm. Fine pitch (P1) may be configured to satisfy printing requirements, and cuts 160 may be configured to maintain process compatibility as well, e.g., by leaving no gaps larger than a printability threshold, e.g., 100 nm. Targets 150 may be configured to have a zero, or very small, NZO (non-zero offsets) in particular when sub-elements 155 are designed as device lines with the same pitch. As the target position is fully determined by the basic lines position (of sub-elements 155), it may have by definition NZO=0 while still providing enough contrast for the measurement optical tool.

Advantageously, while targets 150 do not suffer from printability issues, they also do not impose tough specs on the location of cutting patterns 160, in neither measurement direction or in the perpendicular direction, resulting in a large allowable range of overlay errors for cutting patterns 160, of several nm, possibly even up to 10 nm.

In certain embodiments, sub-elements 155 may be printed at exactly twice the minimal design rule pitch (P1=2·DR) to prevent possible overlap of cutting structures 160 with sub-elements 155 (as may happen, e.g., in cases with P1=DR and with cutting structures 160 printed using extreme dipole illumination). Configuring target 150 with P1=2·DR may maintain small or zero NZO even beyond the large range of overlay error tolerance cutting patterns 160, as shown below in Equation 1, expressing the aerial intensity distribution in terms of fine pitch P1 and states for asymmetric aberration phase shift (denoted by $\phi$) corresponding to illumination position in the pupil $$I(x) = I_0 + I_1 \cdot \cos\left(\frac{2\pi}{P_1}x + \phi\right) + I_2 \cdot \cos\left(\frac{4\pi}{P_1}x + 2\phi\right) \quad \text{Equation 1}$$

$$\Delta x = \frac{P_1}{2\pi}\phi,$$

The inventors note that the corresponding shift in target position is which is the same as for target 150 printed with P1 equaling minimal design rule pitch, for which the aerial intensity distribution is described in Equations 2 (in Equations 2, P2=1·DR and P1=2·DR).

$$I(x) = I_0 + I_1 \cdot \cos\left(\frac{2\pi}{P_2}x + 2\phi\right) \text{ and } \Delta x = \frac{P_2}{\pi}\phi = \frac{P_1}{2\pi}\phi \quad \text{Equations 2}$$

Figure 7A:
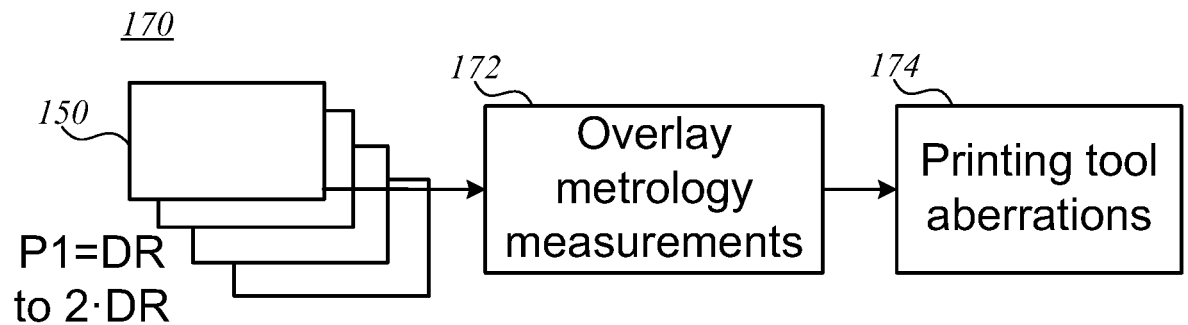
FIGS. 7A and 7B are high level schematic illustrations of additional measurements using targets, according to some embodiments of the invention.
Figure 7B:
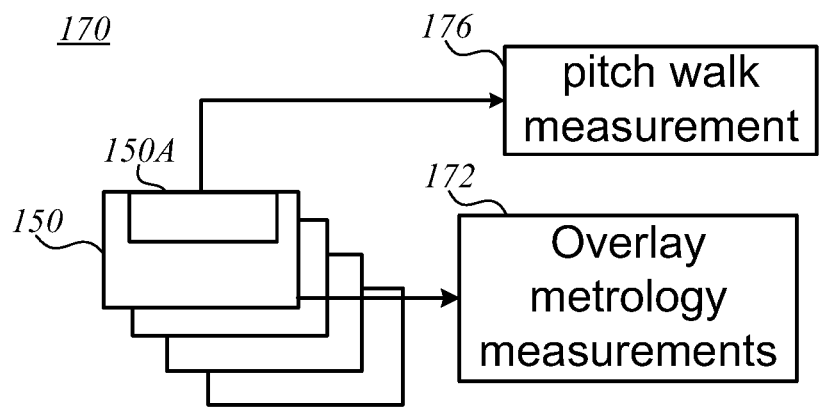

FIGS. 7A and 7B are high level schematic illustrations of additional measurements 170 using targets 150, according to some embodiments of the invention. Certain embodiments may utilize targets 150 for additional measurements, such as scanner aberrations measurement 174, pitch walk measurement 176 etc. For scanner aberrations measurement 174, simultaneous targets 150 with segmentation pitches (fine pitch P1) in the range from minimal design rule (DR) up to twice the minimal design rule (2·DR) may be printed, cut as disclosed above and measured by overlay metrology tools 172. The results of overlay measurements between different cells 150 corresponding to different segmentation pitches (fine pitch P1) provide a basis for scanner aberration amplitudes calculation as it is described in U.S. patent application Ser. No. 14/820917, which is incorporated herein by reference in its entirety. For pitch walk measurement 176, simultaneous targets 150 may comprise two cells 150A, each representing a periodic structure printed on different steps of the double patterning procedure (multiple cells 150A may be used for measuring pitch walk in a multiple patterning procedure), while other periodic structures in target 150 are transformed into CD modulation targets using the cutting procedure.

Figure 8:
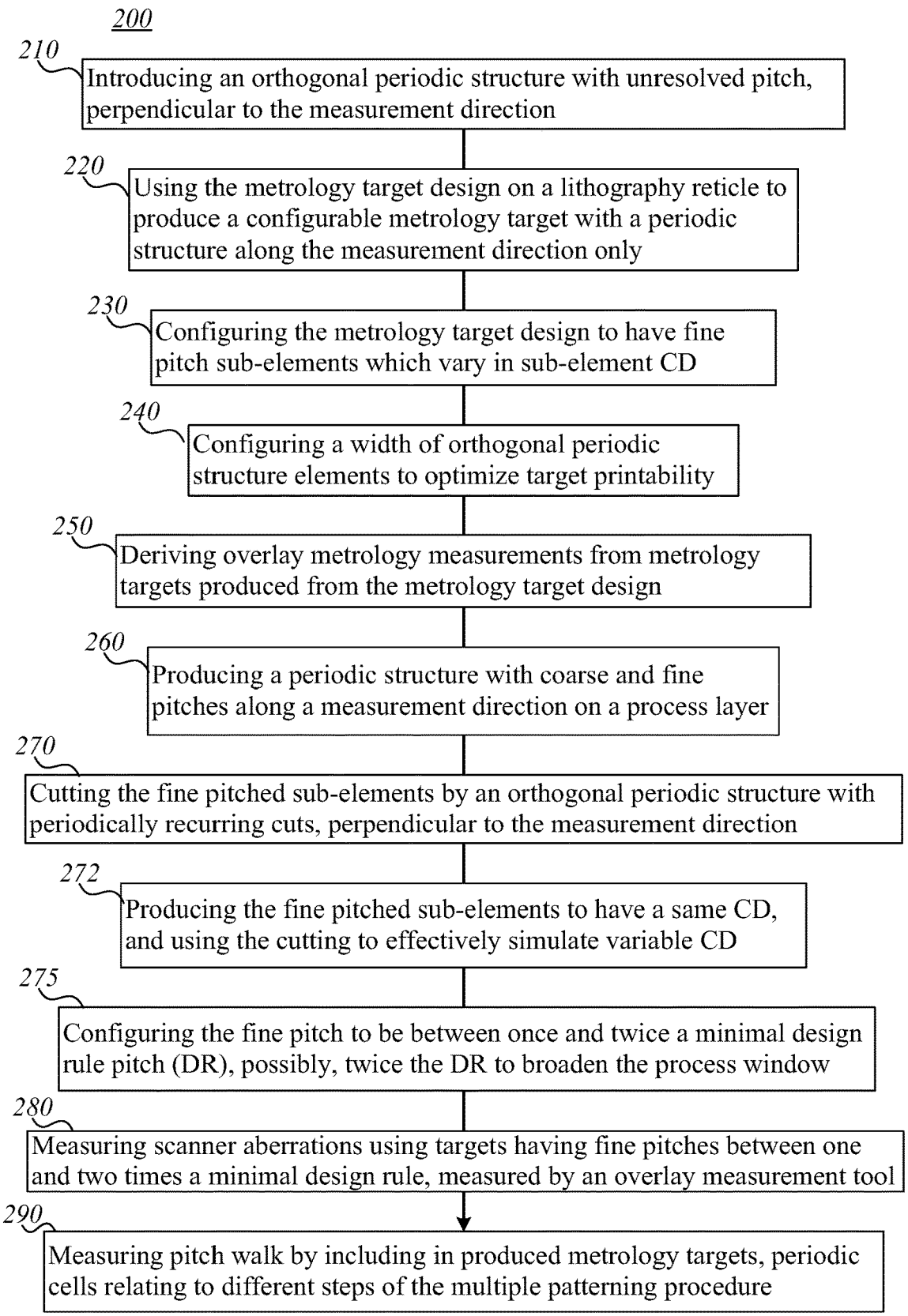
FIG. 8 is a high level flowchart illustrating a method, according to some embodiments of the invention.

FIG. 8 is a high level flowchart illustrating a method 200, according to some embodiments of the invention. The method stages may be carried out with respect to target designs 100 and/or targets 150 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 may comprise introducing (stage 210), to a metrology target design comprising a periodic structure along a measurement direction, an orthogonal periodic structure having an orthogonal unresolved pitch, perpendicular to the measurement direction, and using (stage 220) the metrology target design on a lithography reticle to produce a configurable metrology target with a periodic structure along the measurement direction only. Method 200 may comprise configuring (stage 230) the metrology target design to have the periodic structure comprise periodically recurring elements at a coarse pitch with each element being periodic along the measurement direction with a fine pitch among periodically recurring sub-elements, which vary in sub-element CD, wherein the coarse pitch is an integer multiple of the fine pitch.

Method 200 may further comprise configuring a width of orthogonal periodic structure elements to optimize target printability (stage 240). Method 200 may further comprise deriving overlay metrology measurements from metrology targets produced from the metrology target design (stage 250).

Method 200 may comprise producing (stage 260) a periodic structure along a measurement direction on a process layer, the periodic structure having a coarse pitch among periodically recurring elements, wherein each element is periodic along the measurement direction with a fine pitch among periodically recurring sub-elements, which have a same CD; and cutting (stage 270) the sub-elements by an orthogonal periodic structure, perpendicular to the measurement direction, having periodically recurring cuts.

In certain embodiments, method 200 may comprise producing the fine pitched sub-elements to have a same CD, and using the cutting to effectively simulate variable CD (stage 272). The fine pitch may be configured to be between once and twice a minimal design rule pitch (DR), possibly, twice the DR to broaden the process window (stage 275).

Method 200 may further comprise measuring scanner aberrations (stage 280) using a plurality of produced metrology targets having fine pitches between one and two times a minimal design rule, measured by an overlay measurement tool.

Method 200 may further comprise comprising measuring pitch walk (stage 290) by including in produced metrology targets, periodic cells relating to different steps of a multiple patterning procedure.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target design comprising a periodic structure along a measurement direction, having a coarse pitch among periodically recurring elements,
    wherein each element is periodic along the measurement direction with a fine pitch in the measurement direction among periodically recurring sub-elements, wherein the coarse pitch is an integer multiple of the fine pitch and in the measurement direction, and wherein one of the periodically recurring sub-elements has a first sub-element critical dimension in the measurement direction and another of the periodically recurring sub-elements has a second sub-element critical dimension in the measurement direction different from the first sub-element critical dimension, and
    wherein the target design further comprises an orthogonal periodic structure including periodically recurring bars having an orthogonal unresolved pitch orthogonal to the measurement direction, wherein the orthogonal unresolved pitch is smaller than a specified minimal design rule pitch such that the periodically recurring bars are configured to not be printed.

2. A lithography reticle comprising the metrology target design of claim 1.

3. A metrology target produced using the reticle of claim 2.

4. The metrology target of claim 3, comprising a target periodic structure along the measurement direction, having a target coarse pitch among periodically recurring target elements,
    wherein each target element is periodic along the measurement direction with a target fine pitch among periodically recurring target sub-elements, which vary in target sub-element critical dimension, wherein the target coarse pitch is an integer multiple of the target fine pitch.

5. A wafer comprising at least one metrology target of claim 3.

6. A target design file of at least one metrology target of claim 3.

7. A method comprising:
    introducing, to a metrology target design comprising a periodic structure along a measurement direction, an orthogonal periodic structure including periodically recurring bars having an orthogonal unresolved pitch orthogonal to the measurement direction, wherein the orthogonal unresolved pitch is smaller than a specified minimal design rule pitch such that the periodically recurring bars are configured to not be printed, and
    using the metrology target design on a lithography reticle to produce a configurable metrology target with a periodic structure along the measurement direction only,
    configuring the metrology target design to have the periodic structure comprise periodically recurring elements at a coarse pitch with each element being periodic along the measurement direction with a fine pitch among periodically recurring sub-elements wherein the coarse pitch is an integer multiple of the fine pitch, and wherein one of the periodically recurring sub-elements has a first sub-element critical dimension in the measurement direction and another of the periodically recurring sub-elements has a second sub-element critical dimension in the measurement direction different from the first sub-element critical dimension.

8. The method of claim 7, further comprising configuring a width of orthogonal periodic structure elements to optimize target printability.

9. The method of claim 8, further comprising deriving overlay metrology measurements from metrology targets produced from the metrology target design.

* * * * *